Feb. 6, 1951 B. N. FISHER 2,540,196
TUNING DEVICE
Filed Feb. 1, 1949 2 Sheets-Sheet 1

INVENTOR.
BERNE N. FISHER
BY Jameson & Franklin
ATTORNEYS.

Feb. 6, 1951 B. N. FISHER 2,540,196

TUNING DEVICE

Filed Feb. 1, 1949 2 Sheets-Sheet 2

INVENTOR.
BERNE N. FISHER
BY
Jamesand Franklin
ATTORNEYS

Patented Feb. 6, 1951

2,540,196

UNITED STATES PATENT OFFICE 2,540,196

TUNING DEVICE

Berne N. Fisher, Roselle, N. J., assignor to General Instrument Corporation, Elizabeth, N. J., a corporation of New Jersey Application February 1, 1949, Serial No. 73,922

16 Claims. (Cl. 175—41.5)

The present invention relates to a tuning device and in particular to one suited for the reception of a plurality of preselected frequencies, especially very high frequencies of the type employed in television transmission.

Tuning devices have in the past taken many forms, of which the rotary variable condenser has been the most common. Many problems have arisen, however, in attempting to adapt the standard rotary variable condenser for television tuning purposes, among which may be mentioned the difficulty in devising a single condenser capable of tuning over the entire television band. Hence, it has heretofore generally been necessary, when a rotary variable condenser is employed for tuning purposes, to utilize a plurality of tuning coils to be associated one at a time with each condenser, the coils being appropriately connected and disconnected into the circuit by means of any suitable switching mechanism. The variability, short life, and non-dependability of contact switching mechanisms have long been known and many expedients have been employed to avoid their use in high fidelity receiving circuits. The use of a plurality of condensers associated one at a time with a single inductance coil has also been proposed but such condensers also had to be selectively electrically connected into the circuit by means of undesirable contact switching mechanisms.

The construction of rotary variable condensers as heretofore known has provided for some adjustment of the condensers, as by bending portions of the rotor or stator plates, but this adjustment, when once accomplished, is semi-permanent in nature and can only be revised by a skilled technician. Accordingly, additional trimmer condensers or adjustable inductance coils have had to be employed to modify the tuning of a circuit for any given position of the condenser.

The plates of conventional rotary variable condensers are, by reason of their construction, very susceptible to misalignment, to vibration, and to changes in atmospheric conditions. This is particularly true when very high capacitances are required, since then the interleaving plates of the condenser must be placed extremely close to one another, but is of significance whenever accurate pretuning is involved, as in the case of television reception. This factor has been of prime importance in restricting the use of standard rotary variable condensers in such reception.

Television transmission is today carried out on a plurality of separated wave lengths or channels and consequently a television receiving set need be tunable only to those channels and to none other. However, the frequencies of those channels are so high that even if a receiving set is initially properly tuned thereto, variations in atmospheric conditions and normal aging of the circuit elements will necessitate readjustments from time to time, the frequency of such readjustments requiring that they be capable of being made conveniently and by technically unskilled personnel.

It is therefore a prime object of the present invention to devise a television tuning unit which is capable of tuning a plurality of preselected frequencies and of being adjusted so as to compensate for varying conditions, thus providing optimum fidelity of reception for the receiving set with which the tuning unit is employed.

Another object of the present invention is to devise a rotary variable condenser of novel construction which is less susceptible to vibration, and which is more accurate in tuning than previous constructions.

A further object of the present invention is to devise such a rotary variable condenser which is movable to a plurality of preselected positions and in which the capacitance thereof may be adjusted in each of said preselected positions.

It is yet another object of the present invention to devise a rotary variable condenser consisting of a stator plate, a rotor plate, and an auxiliary plate movable with the rotor plate and adjustable with respect thereto so as to vary the capacitance of the condenser. A corollary object is to incorporate such auxiliary plates in a rotary variable condenser movable to a plurality of preselected positions, one such auxiliary plate at a time being moved with the rotor plate into capacitive relationship with the stator plate, each of said auxiliary plates being presettable to a desired position with respect to the rotor and stator plates and adjustable in that position so as to predetermine and vary the capacitance of the condenser in each of said positions.

It is an additional object of the present invention to devise such a condenser in which each of the auxiliary plates is rendered accessible for adjustment when it is in capacitive relationship with the stator plate.

It is still a further object of the present invention to devise such a condenser which is of simple, sturdy and inexpensive construction, by reason of which the capacitance may be precisely controlled and may be relatively insensitive to dislocation or disadjustment.

To the accomplishment of the foregoing objects and such other objects as may hereinafter appear, the present invention relates to the construction of a tuning device as defined in the appended claims and as described in this specification, taken together with the accompanying drawings, in which:

The tuning device of the present invention constitutes a special and novel form of rotary variable condenser including a pair of opposed stationary or stator plates A and A', a movable or rotor plate B movable with respect to the stator plates A and A' so as to vary the capacitance therebetween, and a plurality of auxiliary condenser plates C electrically connected to the rotor plate B, movable therewith into and out of capacitive relationship with the stator plates A and A' and adjustably mounted with respect to the rotor plate B so as to be variably spaceable with respect to the stator plates A and A', thus modifying the variation in capacitance of the condenser as the rotor plate B is moved.

Figure 5:
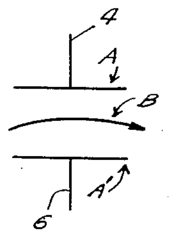
Fig. 5 is a schematic representation of the capacitance defined by the tuning device.

More specifically, the tuning device includes a frame, the only portion of which here disclosed is the base plate 2, on which the stator plates A and A' are secured. In the preferred form here disclosed, the stator plates A and A' are electrically and physically separated from one another and are connected to appropriate circuit elements by means of the leads 4 and 6 respectively (see Fig. 5). The base plate 2 is provided with an aperture 8 between the separated stator plates A and A' for a purpose hereafter to be described.

A carriage in the form of a drum 10 of any suitable insulating material is mounted on shaft 12 for rotation therewith, the shaft in turn being rotatably mounted in the frame and provided with a suitable detenting mechanism (not shown) so as to be movable to a plurality of predetermined positions which, in the embodiment here disclosed, may correspond to a plurality of television transmission channels. In the figures, six equidistantly spaced positions are illustrated, but more or less may be used, and they may be irregularly spaced if desired. The rotor plate B is secured to the drum 10 so as to be movable therewith into and out of capacitive relationship with the stator plates A and A'. In this preferred embodiment the plate B is positioned so as to cover portions of both sides 14 and 16 of the drum 10 and also to extend over the periphery 18 of the drum 10 between the sides 14 and 16, the stator plates A and A' being provided with depending portions 20 parallel to and interleaving with the portions of the sides 14 and 16 of the drum 10 and portions 22 secured to the base plate 2 and being parallel to and overlying the periphery 18 of the drum. The rotor plate B may take the form either of a conductive coating deposited on the drum 10 or of a self-sustainable metallic cap or sheath secured to the drum 10 by means of pins 24. The rotor plate B is, as thus illustrated, of the electrically floating type, capacitively linking the two opposed stator plates A and A' but not itself being connected directly to any of the circuit elements. This mode of electrical interrelationship has proved to be particularly desirable for television tuning units but it will be apparent that the invention is not limited thereto. For example, only one stator plate A could be employed and the rotor plate B could be electrically connected to the shaft 12 as in the case of conventional rotary variable condensers.

The periphery 18 of the drum 10 is provided with a plurality of spaced recesses 26, one for each of the predetermined positions in which the drum 10 is positionable, the recesses 26 being so spaced along the periphery 18 of the drum 10 as to be adapted to be brought one by one between the stator plates A and A' as the drum 10 is rotated to its predetermined positions. Each of the auxiliary condenser plates C, which may take the form of a bendable conductive plate 28, is secured in one of the recesses 26, so that for each of the predetermined positions of the drum 10, one of the auxiliary condenser plates C is moved into capacitive relationship with the stator plates A and A'. The auxiliary condenser plates C are adjustably positionable with respect to the drum 10 on which they are secured, so that their spacing from the stator plates A and A' and in particular from the portions 22 thereof, may be varied, thereby varying the capacitive linking between said plates A and A'. It will, of course, be understood that the rotor plate B may be appropriately shaped so as to additionally vary the capacitive linking between the stator plates A and A', the variation in shape of the plate B providing the primary tuning effect and the variability of position of each of the auxiliary condenser plates C serving as a vernier adjustment or modification for said capacitive linking.

Figure 4:
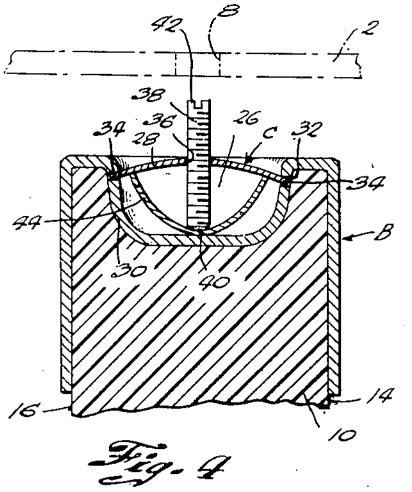
Fig. 4 is a view an an enlarged scale of the upper portion of Fig. 3 showing the details of connection of the auxiliary and rotor condenser plates.
Figure 3:
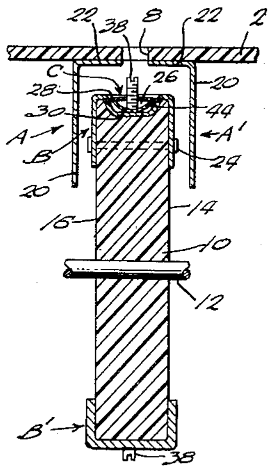
Fig. 3 is an end cross-sectional view taken along the line 3—3 of Fig. 1.

In order for this effect to obtain, it is therefore necessary that the auxiliary condenser plates C be electrically connected to the rotor plate B. This may be accomplished in a variety of ways. As here disclosed, the plate B not only extends over the periphery 18 of the drum 10 but also extends into and completely covers the inner surface of each of the recesses 26 (see the portion 30 of the rotor plate B in Figs. 3, 4 and 9). This is most conveniently accomplished when the plate B is in the form of a deposited coating. Apertures 32 are provided in the sides of the portion 30 and ears 34 on the plate 28 are receivable in the apertures 32, thus simultaneously securing the auxiliary condenser plates C in the recesses 26 and achieving electrical connection between them and the rotor plate B. The central portion of the plate 28 is provided with an aperture 36 and a threaded member in the form of a screw 38 is received therein, one end 40 of the screw 38 bearing against the bottom of the recess, and the other end 42 thereof being slotted and projecting out from the periphery 18 of the drum 10. If desired, a resilient member in the form of a spring cup 44 may be interposed between the bottom of the recesses 26 and the plate 28 so as to be active on the plate 28 to urge it outwardly.

As the drum 10 is rotated to each of its predetermined positions, and therefore as each of the auxiliary condenser plates C is brought into capacitive relationship with the stator plates A and A', the end 42 of the threaded element 38 which projects out from the periphery 18 of the drum 10 is brought opposite the aperture 8 in the base plate 2. Hence, if the tuning achieved by the device in any one of its predetermined positions does not provide for optimum fidelity of reception, rotation of the projecting end 42 of the threaded element 38 which is accessible through the aperture 8 will cause the auxiliary condenser plate C to approach or recede from the stator plates A and A', thus increasing or decreasing the capacitive linking between the plates A and A' and hence varying the tuning of the device.

Figure 1:
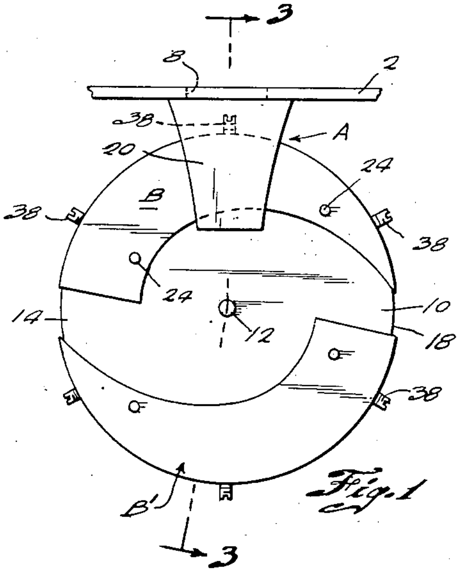
Fig. 1 is a side view of one embodiment of the present invention.
Figure 2:
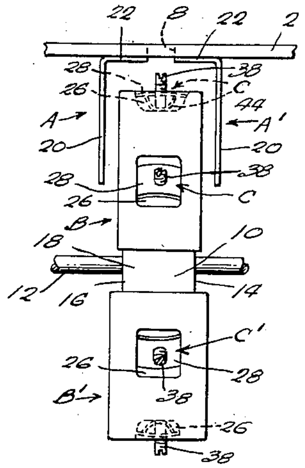
Fig. 2 is an end elevational view thereof.

In many cases a single second plate B will not provide sufficient variation in capacitive linking between the stator plates A and A' to tune the device over the entire television band. Accordingly, an additional plate B' may be secured to the drum 10, either of different shape from the plate B or, as specifically disclosed in Figs. 1, 2 and 3, of different thickness. The thicker plate B' will approach the portions 20 and 22 of the stator plates A and A' more closely than did the plate B and hence the capacitance of the tuning unit will be greatly increased when the plate B' is brought into capacitive relationship with the stator plates A and A'. Note that with this construction the entire television tuning band may be tuned without the employment of any contact switching mechanism. Note also that since the rotor plates B and B' are fixed to the drum 10, which in turn constitutes a rigid supporting element, only the stator plates A and A' are subject to any misalignment or vibration and these plates A and A' may be made extremely structurally strong so that the entire device is rigid and resistant to deformation or vibration. By reason of this resistance, high capacitances can be obtained in a very precise manner, since the plates A and A' and B and B' may be very closely spaced without deleterious effects.

Figure 6:
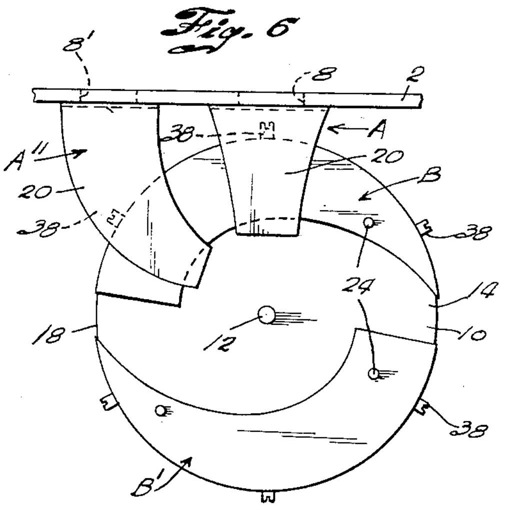
Fig. 6 is a side view similar to Fig. 1 but showing an alternative embodiment.
Figure 7:
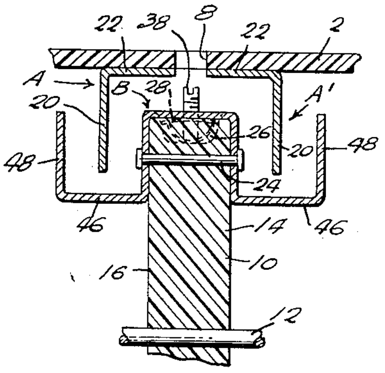
Fig. 7 is an end cross-sectional view similar to Fig. 3 but showing yet another embodiment.
Figure 8:
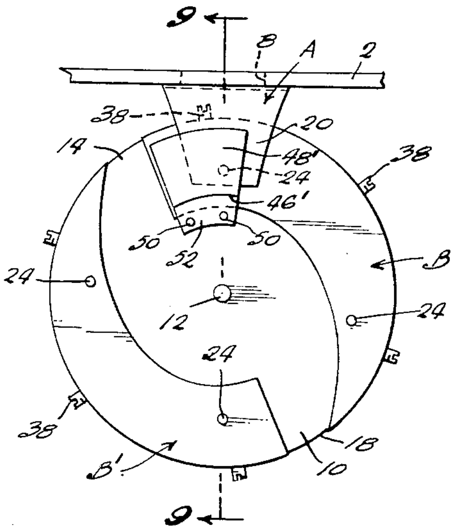
Fig. 8 is a side view similar to Fig. 1 but showing still another embodiment.
Figure 9:
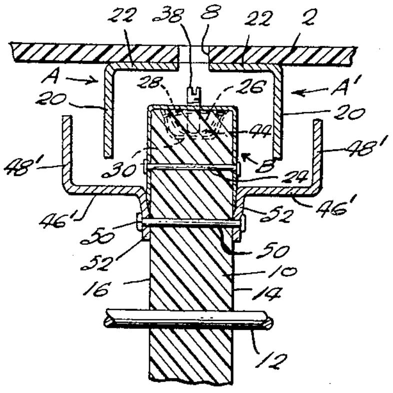
Fig. 9 is an end cross-sectional view taken along the line 9—9 of Fig. 8.

Fig. 6 discloses another embodiment of the present invention in which a second pair of stator plates A'' are secured to the base plate 2 spaced from the plates A, A', the area of the plates A'' varying from the area of the plates A and A' so as to provide an additional capacitance variation. An external switching mechanism is generally necessary to connect either the plates A and A' or the plates A'' into the circuit but by reason of the construction disclosed in Fig. 6, a tuning device can be constructed which is capable of multi-band tuning, the plates A and A', for example, being used for the tuning of television reception, and the plates A'' being used for the reception of frequency modulated sound. An aperture 8' is provided in the base plate 2 between the plates A'' so that the adjusting screws 38 may be manipulated when their respective auxiliary condenser plates C are brought into capacitive relationship with the plates A''.

Where additional capacitance is required, the construction disclosed in Fig. 7 may be employed. There the plate B not only extends over a portion of the sides 14 and 16 and over the periphery 18 of the drum 10 but also projects out from the sides 14 and 16 in the channel shape defined by the horizontal portions 46 and the vertical portions 48, the vertical portions 20 of the stator plates A and A' being received within said channels. In Fig. 7 the spacing between the thus defined rotor plate B and the stator plates A and A' is exaggerated for purposes of clarity.

Where additional capacitance is required only over a portion of the plate B or B', the channel shape of the plates B and B' may be only segmentally provided as is disclosed in Figs. 8 and 9. There, the horizontal portions 46' and vertical portions 48' of the rotor plate B are defined by appropriately bent conductive sheets secured, by means of the pins 50, to only a portion of the plate B, the vertical portions 52 of the additional plate directly secured to the drum 10 overlying and hence making physical and electrical contact with the plate B proper.

The tuning device as above described constitutes a particularly sturdy structure not susceptible to vibration or deformation, the capacitance of which may be very closely and precisely controlled. After the rotary tuning element has been moved to any one of its predetermined positions, the position of the particular auxiliary condenser plate C which is then in the capacitive circuit may be adjusted so as to vary the capacitance of the device within limits and thus compensate for any variations in the characteristics of the remainder of the circuit or in atmospheric conditions. The appropriate auxiliary condenser plate C is, by reason of its being brought into the capacitive circuit, at the same time placed in appropriate position for ready adjustment, which adjustment may be conveniently performed even by an unskilled person, it being necessary only to rotate the threaded element 38 until the desired sharpness of tuning is achieved. The construction of the device lends itself readily to the achievement of any desired degree of capacitive linking, permits broad-band tuning without the necessity of employing any contact switching devices, is inexpensively constructed, and is both mechanically and electrically sturdy and dependable.

It will be apparent that many variations may be made in the specific design of the tuning device without departing from the spirit of the invention as defined in the following claims.

I claim:

1. A tuning device comprising a frame, a stator plate mounted thereon, a movable plate having an area greater than that of said stator plate mounted on said frame for movement to a plurality of predetermined positions and cooperable with said stator plate to define a capacitance therewith in all of said positions, and a plurality of auxiliary condenser plates, one for each of said positions, each having an area comparable to said stator plate, adapted to be selectively brought into capacitive relationship with said stator plate, said auxiliary condenser plates being electrically connected to said movable plate and adjustably carried thereby so as to be variably spaceable from said stator plate, thereby providing for adjustment of the capacitance in each of said positions.

2. A tuning device comprising a frame, a stator plate mounted thereon, an insulating carriage mounted in said frame for movement to a plurality of predetermined positions, a movable plate having an area greater than that of said stator plate on said carriage cooperable with said stator plate to define a capacitance therewith in all of said positions, and a plurality of auxiliary condenser plates, one for each of said positions, each having an area comparable to said stator plate, adapted to be selectively brought into capacitive relationship with said stator plate, said auxiliary condenser plates being electrically connected to said movable plate and adjustably carried thereby so as to be variably spaceable from said stator plate, thereby providing for adjustability of the capacitance in each of said positions.

3. A tuning device comprising a frame, a stator plate mounted thereon, a cylindrical body of insulating material rotatably mounted in said frame for movement to a plurality of predetermined positions, said cylindrical body being positioned alongside said stator plate, a rotor plate on said cylindrical body cooperable with said stator plate to define a capacitance therewith in all of said positions, and a plurality of auxiliary condenser plates, one for each of said positions, adapted to be selectively brought into capacitive relationship with said stator plate, said auxiliary condenser plates being adjustably secured to said cylindrical body and electrically connected to said rotor plate so as to be variably spaceable from said stator plate, thereby providing for adjustability of the capacitance in each of said positions.

4. A tuning device comprising a frame, a pair of opposed stator plates mounted thereon, a movable plate having an area greater than that of said stator plates mounted on said frame between and capacitively linking said stator plates, said movable plate being movable to a plurality of predetermined positions, and a plurality of auxiliary condenser plates, one for each of said positions, each having an area comparable to that of said stator plates, adapted to be selectively brought into capacitive relationship with said stator plates, said auxiliary condenser plates being electrically connected to said movable plate and adjustably carried thereby so as to be variably spaceable from said stator plates, thereby providing for adjustability of the capacitive linking in each of said positions.

5. A tuning device comprising a frame, a pair of opposed stator plates mounted thereon, a cylindrical body of insulating material rotatably mounted in said frame between said stator plates, said cylindrical body being movable to a plurality of predetermined positions, a rotor plate on and movable with said cylindrical body for capacitively linking said stator plates in all of said positions, said rotor plate having an area greater than that of said stator plates, and a plurality of auxiliary condenser plates, one for each of said positions, each having an area comparable to that of said stator plates adapted to be selectively brought into capacitive relationship with said stator plates, said auxiliary condenser plates being electrically connected to said rotor plate and adjustably carried by said cylindrical body so as to be variably spaceable from said stator plates, thereby providing for adjustability of the capacitive linking in each of said positions.

6. A tuning device comprising a frame, a pair of opposed stator plates mounted thereon, a drum rotatably mounted in said frame for interleaving between said stator plates, said drum being movable to a plurality of predetermined positions, a rotor plate extending on both sides and over the periphery of said drum and movable with said drum for capacitively linking said stator plates in all of said positions, and a plurality of auxiliary condenser plates, one for each of said positions, adapted to be selectively brought into capacitive relationship with said stator plates, said auxiliary condenser plates being electrically connected to said rotor plate and adjustably secured to said drum so as to be variably spaceable from said stator plates, thereby providing for adjustability of the capacitive linking in each of said positions.

7. A tuning device comprising a frame, a pair of opposed stator plates mounted thereon, a drum rotatably mounted in said frame for interleaving between said stator plates, said drum being movable to a plurality of predetermined positions, a rotor plate extending on both sides and over the periphery of said drum and movable with said drum for capacitively linking said stator plates, and a plurality of auxiliary condenser plates, one for each of said positions, adapted to be selectively brought into capacitive relationship with said stator plates, said auxiliary condenser plates being electrically connected to said rotor plate and adjustably secured to the periphery of said drum so as to be variably spaceable from said stator plates, thereby providing for adjustability of the capacitive linking in each of said positions.

8. A tuning device comprising a frame, a pair of opposed stator plates mounted thereon, a drum rotatably mounted in said frame for interleaving between said stator plates and movable to a plurality of predetermined positions, the periphery of said drum being provided with a plurality of recesses, one for each of said positions, a rotor plate extending on both sides and over the periphery of said drum for capacitively linking said stator plates in all of said positions, said rotor plate being movable with said drum, and a plurality of auxiliary condenser plates, one for each of said positions, adapted to be selectively brought into capacitive relationship with said stator plates, said auxiliary condenser plates being electrically connected to said rotor plate and being adjustably secured to said drum in said recesses so as to be variably spaceable from said stator plates, thereby providing for adjustability of the capacitive linking in each of said positions.

9. A tuning device comprising a frame, a pair of opposed stator plates mounted thereon, a cylindrical body of insulating material rotatably mounted in said frame between said stator plates and movable to a plurality of predetermined positions, a rotor plate having an area greater than that of said stator plates on said cylindrical body for capacitively linking said stator plates, said rotor plate being movable with said cylindrical body, a plurality of auxiliary condenser plates, one for each of said positions, each having an area comparable to that of said stator plates, adapted to be selectively brought into capacitive relationship with said stator plates, said auxiliary condenser plates being electrically connected to said rotor plate and being adjustably secured on said cylindrical body so as to be variably spaceable from said stator plates, and a plurality of adjusting mechanisms, each active between said cylindrical body and one of said auxiliary condenser plates, projecting from said cylindrical body so as to be accessible from the exterior thereof, said auxiliary condenser plates being variably spaceable from said stator plates through manipulation of said adjusting mechanism, thereby providing for adjustability of the capacitive linking in each of said positions.

10. A tuning device comprising a frame, a pair of opposed stator plates mounted thereon, a cylindrical body of insulating material rotatably mounted in said frame between said stator plates and movable to a plurality of predetermined positions, a rotor plate on said cylindrical body for capacitively linking said stator plates, said rotor plate being movable with said cylindrical body, a plurality of auxiliary condenser plates, one for each of said positions, adapted to be selectively brought into capacitive relationship with said stator plates, said auxiliary condenser plates being secured to the periphery of said cylindrical body and electrically connected to said rotor plate, and a plurality of adjusting mechanisms, each active between said cylindrical body and one of said auxiliary condenser plates, said adjusting mechanisms being accessible at the periphery of said cylindrical body, said auxiliary condenser plates thus being variably spaceable from said stator plates through manipulation of said adjusting mechanism, thereby providing for adjustability of the capacitive linking in each of said positions.

11. A tuning device comprising a frame, a pair of opposed stator plates mounted thereon, a drum rotatably mounted in said frame for interleaving between said stator plates and movable to a plurality of predetermined positions, the periphery of said drum having a plurality of spaced recesses, one for each of said positions, a rotor plate on said drum for capacitively linking said stator plates, said rotor plate extending on both sides and over the periphery of said drum and being movable with said drum, and a plurality of auxiliary condenser plates, one for each of said positions, adapted to be selectively brought into capacitive relationship with said stator plates, each of said auxiliary condenser plates being secured to said drum in one of said recesses, electrical connections between said auxiliary condenser plates and said rotor plate, and a plurality of adjusting mechanisms, each active in one of said recesses between said drum and one of said auxiliary condenser plates and accessible from the periphery of said drum, said auxiliary condenser plates thus being variably spaceable from said stator plates through manipulation of said adjusting mechanism, thereby providing for adjustability of the capacitive linking in each of said positions.

12. The tuning device of claim 11, in which each of said auxiliary condenser plates is connected at its ends to said drum in said recesses and is provided with an aperture, and in which each of said adjusting mechanisms comprises a threaded element the body of which threadedly engages said auxiliary condenser plate at said aperture, one end of which bears against the bottom of said recess, and the other end of which projects out from the periphery of said drum, rotation of said theaded element causing said auxiliary condenser plate to move into and out of said recess.

13. In the tuning device of claim 12, a resilient member active between the interior of said recess and said auxiliary condenser plate so as to urge said auxiliary condenser plate outwardly with respect to said recess.

14. The tuning device of claim 7, in which said stator plates comprise portions parallel to the ends of said drum and portions parallel to the sides thereof, and in which, when said drum is in any of its predetermined positions, the auxiliary condenser plate in capacitive relation with said stator plates is accessible for adjustment between the separated portions of said stator plates parallel to the end of said drum.

15. A tuning device comprising a frame, an L-shaped stator plate mounted therein, a correspondingly L-shaped rotor plate movably mounted in said frame alongside and mating with said stator plate, said rotor plate having an area greater than that of said stator plate and being movable to a plurality of predetermined positions and cooperable with said stator plate to define a capacitance therewith in all of said positions, and a plurality of auxiliary condenser plates, each having an area comparable to that of said stator plate, one for each of said positions, adapted to be selectively brought into capacitive relationship with said stator plate, said auxiliary condenser plates being electrically connected to said rotor plate and adjustably secured thereto so as to be variably spaceable from said stator plate, thereby providing for adjustability of the capacitive linking in each of said positions.

16. A tuning device comprising a frame, an L-shaped stator plate mounted therein, a drum rotatably mounted in said frame alongside said stator plate and with the L thereof, said drum being movable to a plurality of predetermined positions, a rotor plate L-shaped correspondingly to said stator plate carried by and rotatable with said drum, mating with said stator plate, and having an area greater than that of said stator plate, said rotor plate cooperating with said stator plate to define a capacitance therewith in all of said positions, and a plurality of auxiliary condenser plates, each having an area comparable to that of said stator plate, one for each of said positions, adapted to be selectively brought into capacitive relationship with said stator plate, said auxiliary condenser plates being electrically connected to said rotor plate and adjustably secured to said drum so as to be variably spaceable from said stator plate, thereby providing for adjustability of the capacitive linking in each of said positions.

BERNE N. FISHER.

REFERENCES CITED

The following references are of record in the file of this patent:

UNITED STATES PATENTS

| Number | Name | Date |
|---|---|---|
| 1,872,299 | Kerrigan | Aug. 16, 1932 |
| 2,458,187 | Montcalm | Jan. 4, 1949 |

FOREIGN PATENTS

| Number | Country | Date |
|---|---|---|
| 303,758 | Great Britain | Mar. 27, 1930 |